United States Patent
Mehta et al.

(10) Patent No.: US 7,989,911 B1
(45) Date of Patent: Aug. 2, 2011

(54) SHALLOW TRENCH ISOLATION (STI) WITH TRENCH LINER OF INCREASED THICKNESS

(75) Inventors: Sunil Mehta, San Jose, CA (US); Stewart Logie, Campbell, CA (US); Steven Fong, Santa Clara, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/607,868

(22) Filed: Oct. 28, 2009

Related U.S. Application Data

(63) Continuation of application No. 11/436,503, filed on May 18, 2006, now abandoned.

(51) Int. Cl.
*H01L 21/70* (2006.01)

(52) U.S. Cl. ............ 257/506; 257/E21.548; 438/424; 438/437

(58) Field of Classification Search .......... 257/506, 257/E21.548; 438/424, 437
See application file for complete search history.

(56) References Cited

U.S. PATENT DOCUMENTS

| | | | | |
|---|---|---|---|---|
| 6,005,279 | A * | 12/1999 | Luning | 257/510 |
| 6,486,039 | B2 * | 11/2002 | Yoo et al. | 438/425 |
| 6,486,517 | B2 * | 11/2002 | Park | 257/374 |
| 6,613,647 | B2 * | 9/2003 | Kim | 438/424 |
| 6,656,783 | B2 * | 12/2003 | Park | 438/221 |
| 6,670,689 | B2 * | 12/2003 | Oh et al. | 257/506 |
| 7,479,688 | B2 * | 1/2009 | Deshpande et al. | 257/510 |
| 2002/0070430 | A1 * | 6/2002 | Oh et al. | 257/622 |
| 2004/0212035 | A1 * | 10/2004 | Yeo et al. | 257/510 |
| 2005/0142775 | A1 * | 6/2005 | Koh | 438/296 |
| 2007/0200196 | A1 | 8/2007 | Kumar | |
| 2008/0166888 | A1 * | 7/2008 | Hsu et al. | 438/787 |

* cited by examiner

*Primary Examiner* — Jarrett J Stark
(74) *Attorney, Agent, or Firm* — Haynes and Boone, LLP

(57) ABSTRACT

In one embodiment, an integrated circuit includes a substrate having high voltage transistor regions and low voltage transistor regions. The substrate includes a first trench between and adjacent to the high voltage transistor regions, a second trench between and adjacent to the low voltage transistor regions, and a third trench between the first and second trenches and between and adjacent to a high voltage transistor region and a low voltage transistor region. A thicker silicon dioxide layer lines the first trench and a first portion of the third trench adjacent to a high voltage transistor region. A thinner silicon dioxide layer lines the second trench and a second portion of the third trench adjacent to a low voltage transistor region. A silicon nitride layer is present on the thinner silicon dioxide layer and lines the second trench and the second portion of the third trench but is not present on the thicker silicon dioxide layer and does not line the first trench and the first portion of the third trench.

18 Claims, 5 Drawing Sheets

SHALLOW TRENCH ISOLATION (STI) WITH TRENCH LINER OF INCREASED THICKNESS

RELATED APPLICATION DATA

This application is a continuation of U.S. application Ser. No. 11/436,503, filed May 18, 2006, which is incorporated herein in its entirety.

TECHNICAL FIELD

The present invention relates generally to integrated circuits and, more particularly, to the isolation of integrated circuit components.

BACKGROUND

Integrated circuits having transistors in close proximity to each other can often exhibit unintended current leakage between adjacent transistors. As a result, various isolation techniques have been developed to reduce such leakage currents.

Shallow trench isolation (STI) is one conventional approach frequently used to reduce leakage currents for integrated circuits having nominal feature sizes approximately equal to or less than 90 nm. STI entails the creation of a trench between adjacent transistors which is then filled with a dielectric material. The dielectric material (for example, silicon dioxide) provides a barrier which impedes the flow of leakage current between the transistors on opposite sides of the trench.

Unfortunately, the introduction of STI trenches can cause unintended stress on the channels of adjacent transistors. Such STI stress is difficult to model and complicates circuit design. For example, STI stress can depend on the channel type, doping level, width, and length of adjacent transistors, as well as the spacing between the channel and the trench and the spacing between additional trenches.

This stress is generally most pronounced in low voltage transistors (e.g., transistors having an operating voltage in the range of approximately 1.2 volts to 3.3 volts). In such low voltage transistors, STI stress can cause reduced electron mobility and increased hole mobility, resulting in slightly enhanced PMOS performance and significantly degraded NMOS performance. The net effect of such changes is slower performance of integrated circuits (for example, CMOS circuits).

For low voltage transistors, such stress effects can be reduced by lining the STI trench with silicon nitride. Unfortunately, such configurations are generally only suitable for low voltage applications. The introduction of the silicon nitride liner can reduce the performance of high voltage transistors, such as flash memory cells and circuitry that supports flash operation or transistors used at input/output pins, and/or having an operating voltage in the range of approximately 5 volts and higher.

For example, the introduction of a silicon nitride liner can interfere with data retention of adjacent flash memory cells. Because silicon nitride tends to absorb hydrogen, it can interfere with the injection and retention of hot electrons with respect to the floating gates of flash memory cells. The silicon nitride layer can also interfere with the growth of additional silicon dioxide in the corners of STI trenches which may be desired to further round the corners in order to provide more uniform electric field distribution.

As a result, conventional STI techniques are generally unsatisfactory for applications where low voltage and high voltage transistors are embedded within a single integrated circuit. Integrated circuits used in programmable logic devices (PLDs) may include high voltage flash memory cells embedded with low voltage transistors in a single integrated circuit. Accordingly, the use of STI trenches in such devices without a silicon nitride liner can increase stress effects on low voltage transistors, but the use of an additional silicon nitride liner can reduce performance of high voltage transistors. Moreover, the creation of a separate high voltage trench after the creation of a low voltage trench on the same substrate can unduly increase manufacturing and design costs.

As a result, there is a need for an improved STI implementation that reduces the disadvantages described above when applied to integrated circuits that include both high voltage and low voltage transistors.

SUMMARY

In one embodiment, an integrated circuit includes a substrate having first and second high voltage transistor regions and first and second low voltage transistor regions. The substrate further includes a first trench between and adjacent to the first and second high voltage transistor regions, a second trench between and adjacent to the first and second low voltage transistor regions, and a third trench between the first and second trenches and between and adjacent to the second high voltage transistor region and the second low voltage transistor region. A thicker silicon dioxide layer lines the first trench and a first portion of the third trench adjacent to the second high voltage transistor region. A thinner silicon dioxide layer lines the second trench and a second portion of the third trench adjacent to the second low voltage transistor region. A silicon nitride layer is present on the thinner silicon dioxide layer and lines the second trench and the second portion of the third trench but is not present on the thicker silicon dioxide layer and does not line the first trench and the first portion of the third trench. Dielectric material fills the first, second, and third trenches.

In another embodiment, an integrated circuit includes a substrate having first and second high voltage transistor regions and a low voltage transistor region. The substrate further includes a first trench between and adjacent to the first and second high voltage transistor regions and a second trench between and adjacent to the second high voltage transistor region and the low voltage transistor region. A thicker silicon dioxide layer lines the first trench and a first portion of the second trench adjacent to the second high voltage transistor region. A thinner silicon dioxide layer lines a second portion of the second trench adjacent to the low voltage transistor region. A silicon nitride layer is present on the thinner silicon dioxide layer and lines the second portion of the second trench but is not present on the thicker silicon dioxide layer and does not line the first trench and the first portion of the second trench. Dielectric material fills the first and second trenches.

In another embodiment, an integrated circuit includes a substrate having first and second low voltage transistor regions and a high voltage transistor region. The substrate further includes a first trench between and adjacent to the first and second low voltage transistor regions and a second trench between and adjacent to the second low voltage transistor region and the high voltage transistor region. A thinner silicon dioxide layer lines the first trench and a first portion of the second trench adjacent to the second low voltage transistor region. A thicker silicon dioxide layer lines a second portion of the second trench adjacent to the high voltage transistor region. A silicon nitride layer is present on the thinner silicon dioxide layer and lines the first trench and the first portion of the second trench but is not present on the thicker silicon dioxide layer and does not line the second portion of the second trench. Dielectric material fills the first and second trenches.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. Several exemplary implementations will be utilized to illustrate the techniques in accordance with one or more embodiments of the present invention. However, it should be understood that this is not limiting and that the techniques disclosed herein may be implemented as desired, in accordance with one or more embodiments of the present invention, in various types of integrated circuits.

Figure 1:
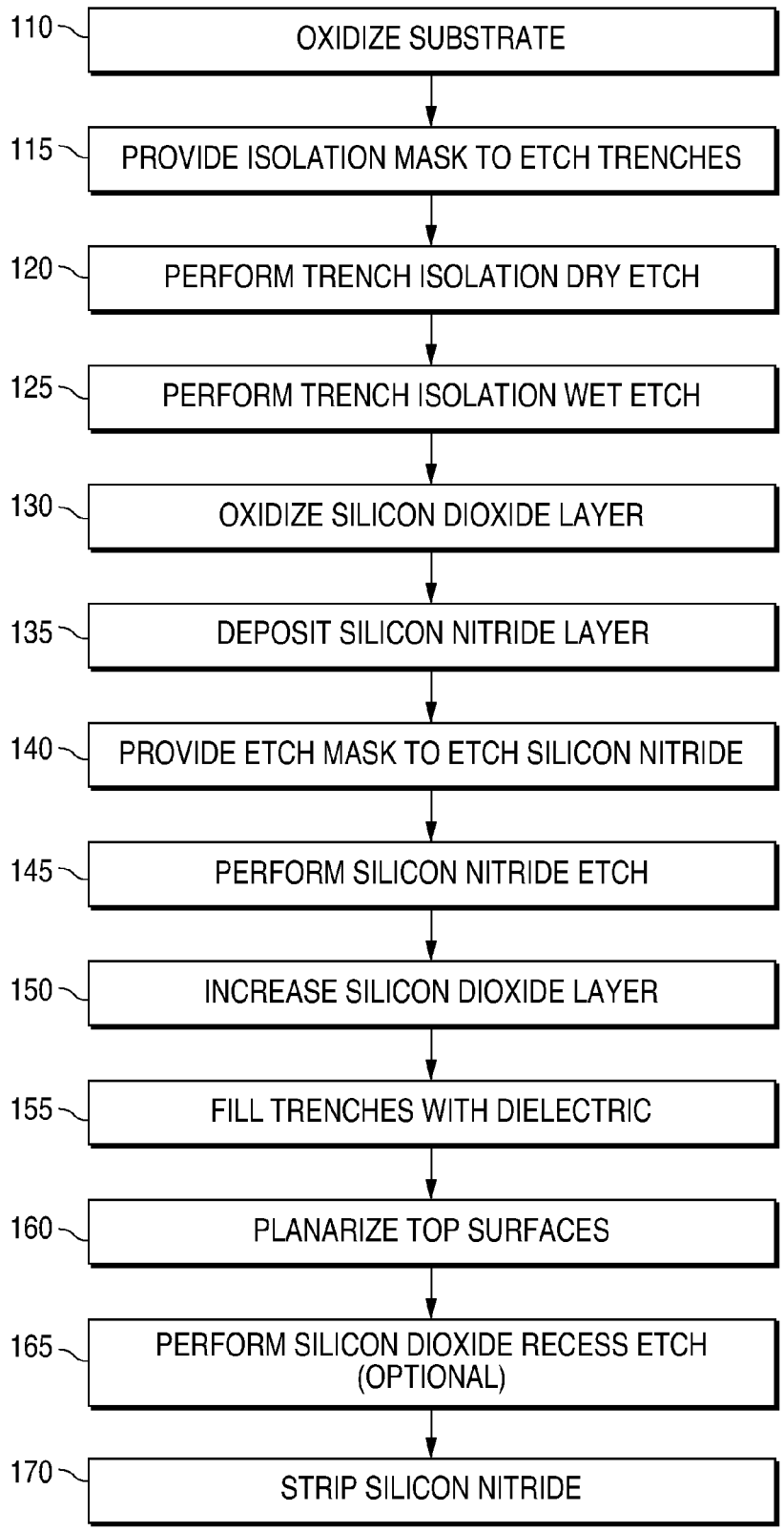
FIG. 1 illustrates a process of manufacturing a semiconductor device providing shallow trench isolation (STI) in accordance with the present invention.

FIG. 1 illustrates a process of manufacturing a semiconductor device providing shallow trench isolation (STI) in accordance with the present invention. In one embodiment, the process of FIG. 1 can be applied to the manufacture of integrated circuits having a nominal feature size approximately equal to 90 nm or less.

As further described herein, the process of FIG. 1 can be performed to create STI regions suitable for use in integrated circuits including both low voltage transistors (e.g., having an operating voltage in the range of approximately 1.2 volts to 2.5 volts) and high voltage transistors (e.g., flash memory cells, transistors used at input/output pins, and/or having an operating voltage in the range of approximately 3.3 volts and higher). It will be appreciated, however, that transistors having an operating voltage of approximately 3.3 volts may be considered low voltage transistors or high voltage transistors in particular applications. Accordingly, transistors having an operating voltage of approximately 3.3 volts may be implemented in appropriate transistor regions adapted to support either high voltage transistors or low voltage transistors as may be desired in particular applications.

FIGS. 2A-E and 3A-E illustrate cross-sectional side views of first and second semiconductor devices 200 and 300, respectively, undergoing the process of FIG. 1 in accordance with various embodiments of the present invention. Semiconductor devices 200 and 300 may be implemented in any desired type of integrated circuit including both high voltage and low voltage transistors. For example, in one embodiment, each of semiconductor devices 200 and 300 may be a programmable logic device (PLD) such as a complex programmable logic device (CPLD) or a field programmable gate array (FPGA).

Figure 2A:
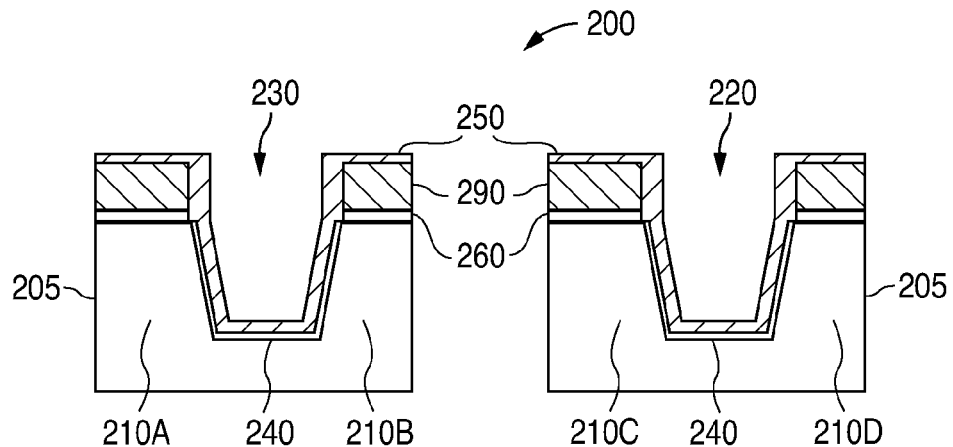
FIGS. 2A-E illustrate cross-sectional side views of a first semiconductor device undergoing the process of FIG. 1 in accordance with an embodiment of the present invention.
Figure 2B:
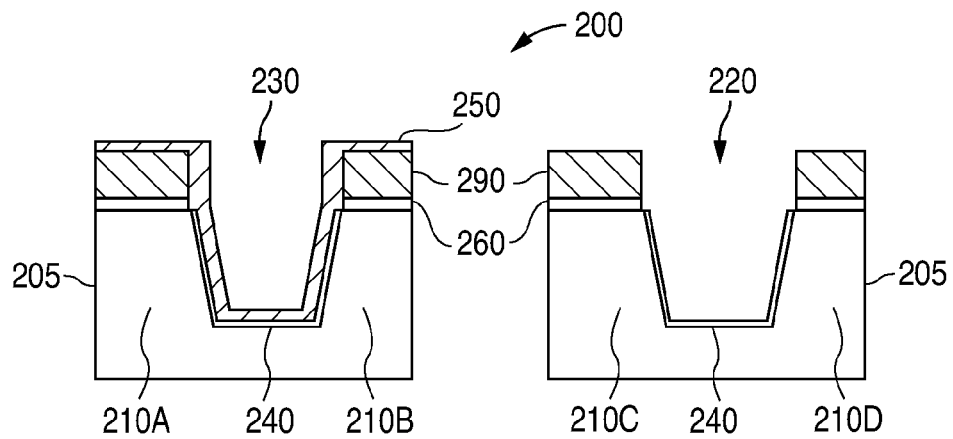
Figure 2C:
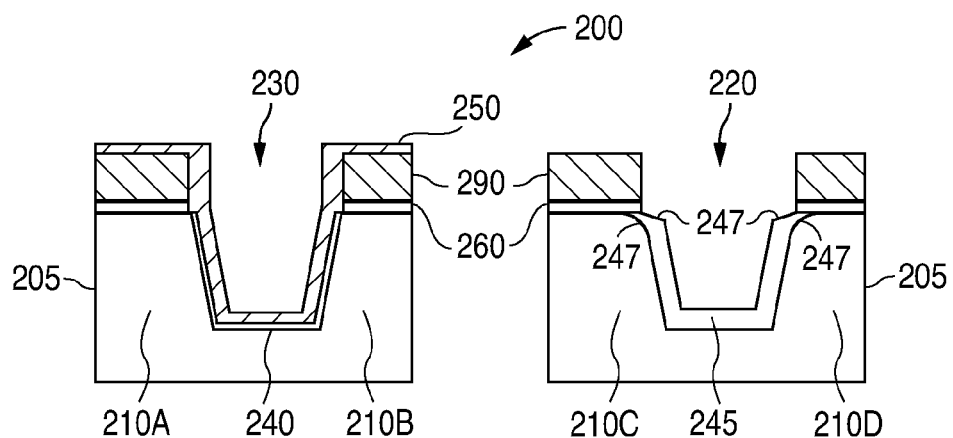
Figure 2D:
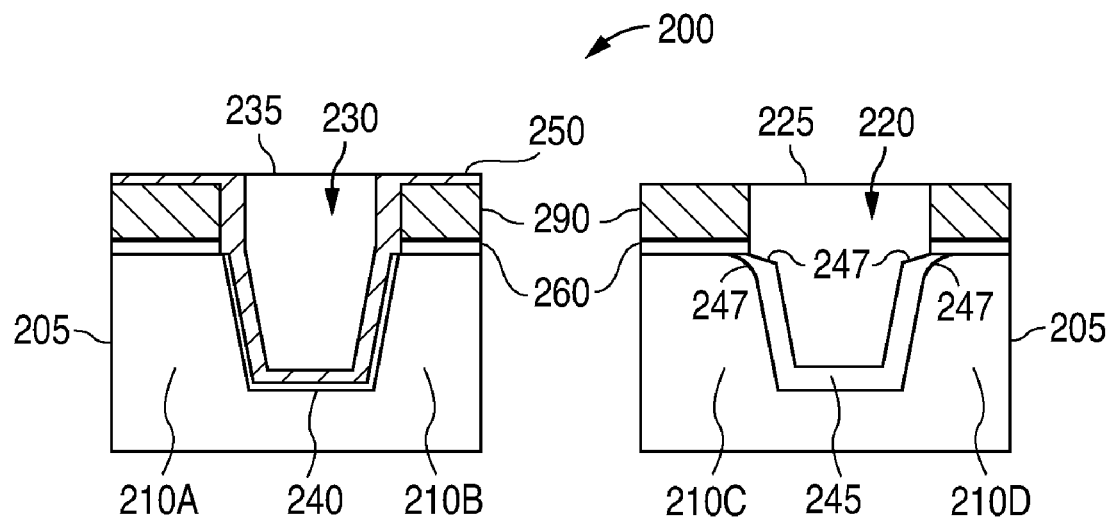
Figure 2E:
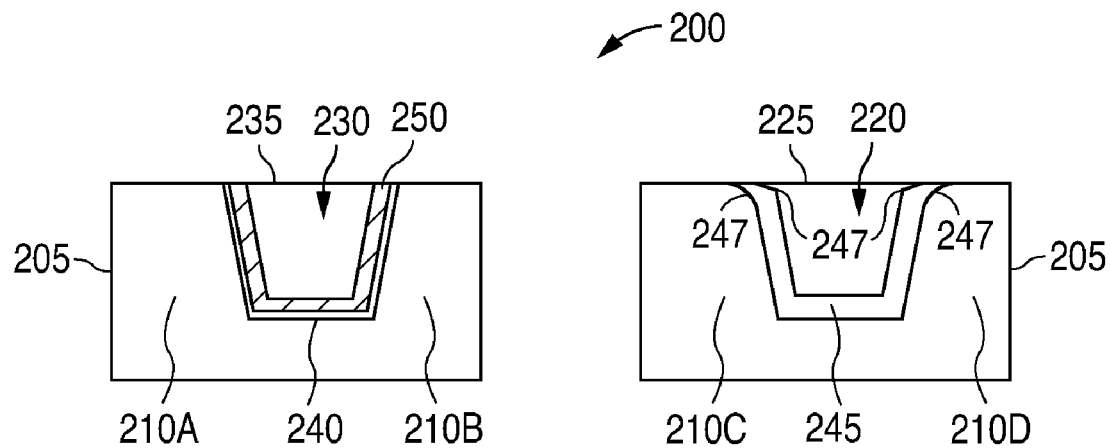
Figure 3A:
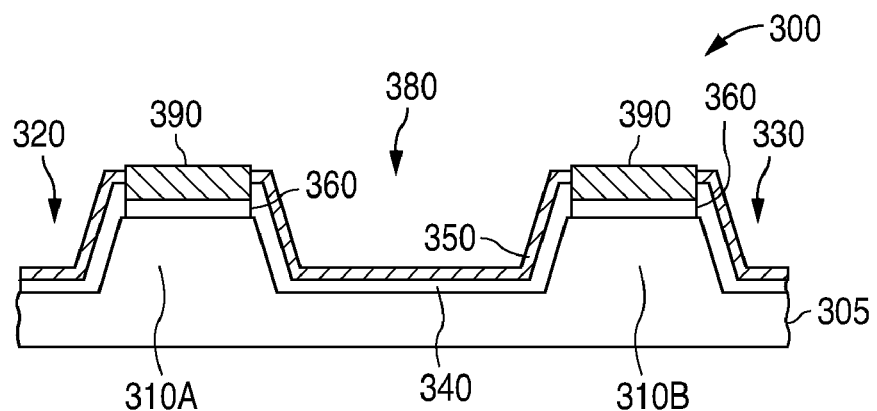
FIGS. 3A-E illustrate cross-sectional side views of a second semiconductor device undergoing the process of FIG. 1 in accordance with an embodiment of the present invention.

FIGS. 2A and 3A illustrate semiconductor devices 200 and 300 having undergone steps 110 through 135 of the process of FIG. 1 as further described herein. As illustrated, semiconductor devices 200 and 300 include substrates 205 and 305 (for example, p-type substrates) having a plurality of trenches 220/230 and 320/330/380 separating a plurality of transistor regions 210A-D and 310A-B, respectively. It will be appreciated that transistors may be manufactured in transistor regions 210A-D and 310A-B following the process of FIG. 1. It will also be appreciated that, for purposes of clarity, a portion of semiconductor device 200 between trenches 220 and 230 is not shown in FIGS. 2A-E. As such, it will be understood that transistor regions 210B and 210C may extend into the portion of semiconductor device 200 not shown. For example, transistor regions 210B and 210C may form a transistor region adjacent to and between trenches 230 and 220.

Turning now to the particular steps of FIG. 1, in step 110, pad oxide layers 260 and 360 are oxidized (i.e., grown) on substrates 205 and 305, respectively. In step 115, hard masks 290 and 390 (i.e., isolation masks) are provided on pad oxide layers 260 and 360, respectively, to isolate transistor regions 210A-D and 310A-B.

A dry etch (step 120) and wet etch (step 125) may then be performed on substrates 205 and 305 to create trenches 220/230 and 320/330/380, respectively. Wet etch step 125 can improve the cleaning and rounding of inside corners of trenches 220/230 and 320/330/380 prior to the performance of further steps in the process of FIG. 1.

At step 130, exposed surfaces (i.e., unmasked portions) of substrates 205 and 305 are oxidized to form silicon dioxide layers 240 and 340 which form silicon dioxide liners in each of trenches 220/230 and 320/330/380. In one embodiment, silicon dioxide layers 240 and 340 may be approximately 3 nm thick.

Silicon nitride layers 250 and 350 are then deposited on top of silicon dioxide layers 240 and 340, respectively (step 135), resulting in the structures illustrated in FIGS. 2A and 3A. In one embodiment, each of silicon nitride layers 250 and 350 may exhibit a thickness in the range of approximately 6 nm to approximately 10 nm.

Figure 3B:
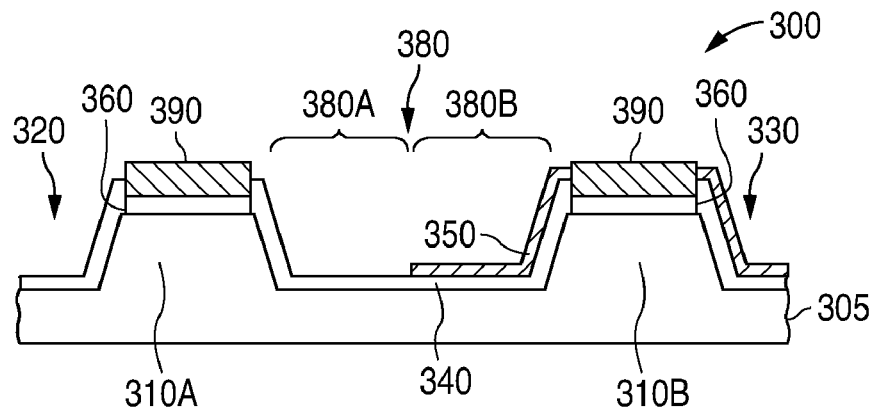

At step 140, an etch mask is provided, which is followed by step 145 in which portions of silicon nitride layers 250 and 350 are etched. FIGS. 2B and 3B illustrate semiconductor devices 200 and 300, respectively, following etching step 145. In the embodiment of FIG. 2B, all portions of silicon nitride layer 250 in trench 220 and above transistor regions 210C-D have been etched away. Conversely, the remaining portions of silicon nitride layer 250 in trench 230 and above transistor regions 210A-B have not been etched in step 145. As a result, the remaining portions of silicon nitride layer 250 effectively provide trench 230 with a silicon nitride liner.

In the embodiment of FIG. 3B, silicon nitride layer 350 has been selectively etched away during step 145. As illustrated, silicon nitride layer 350 has been removed from trench 320 and portion 380A of trench 380. In contrast, portions of silicon nitride layer 350 remain in trench 330 and portion 380B of trench 380. As a result, the remaining portions of silicon nitride layer 350 effectively provide trench 330 with a silicon nitride liner, and also provide portion 380B of trench 380 with a silicon nitride liner. Although trench portions 380A and 380B are shown as substantially equal in width, it will be appreciated that the relative widths of the portions can vary to some degree without affecting the efficacy of the structure.

Figure 3C:
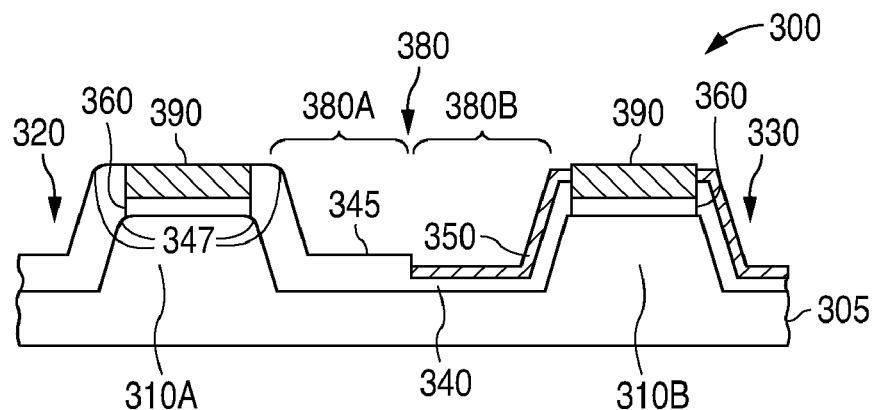

In step 150, additional silicon dioxide is oxidized on exposed portions of silicon dioxide layers 240 and 340. In one embodiment, step 150 may be performed using a high temperature (for example, in excess of approximately 1000 degrees C.) oxide growth process. FIGS. 2C and 3C illustrate embodiments of semiconductor devices 200 and 300, respectively, following the performance of step 150.

In FIG. 2C, the thickness of a portion of silicon dioxide layer 240 has increased to create a thicker silicon dioxide layer 245 (i.e., a thicker silicon dioxide liner) in trench 220. Similarly in FIG. 3C, the thickness of a portion of silicon dioxide layer 340 has increased to create a thicker silicon dioxide layer 345 (i.e., a thicker silicon dioxide liner) in trench 320 and in portion 380A of trench 380.

Advantageously, the performance of step 150 has the effect of causing a plurality of corners 247 and 347 of thicker silicon dioxide layers 245 and 345 to become rounded. In this regard, the rounding of corners 247 and 347 can improve the charge-to-breakdown (QBD) in high voltage transistors manufactured in transistor regions 210C-D and 310A. In particular, the rounding of corners 247 and 347 can aid in the prevention of gate oxide thinning and more evenly distribute electric fields (e.g., less current will be concentrated in trench corners 247 and 347) for high voltage transistors manufactured in transistor regions 210C-D and 310A. It will be appreciated that because thicker silicon dioxide layers 245 and 345 can reduce the effective width of transistors in transistor regions 210C-D and 310A, high voltage transistors are preferred over low voltage transistors in such regions. In one embodiment, thicker silicon dioxide layers 245 and 345 may each exhibit a thickness of approximately 10 nm, approximately 20 nm, approximately 30 nm, or a thickness in the range of approximately 10 nm to approximately 30 nm.

At step 155, trenches 220/230 and 320/330/380 are filled with dielectric material 225/235 and 325/335/385 (for example, silicon dioxide), respectively. Any excess portions of dielectric material 225/235 and 325/335/385 can then be removed through planarization (for example, chemical-mechanical planarization or polishing) of the top surfaces of semiconductor devices 200 and 300, respectively (step 160).

Figure 3D:
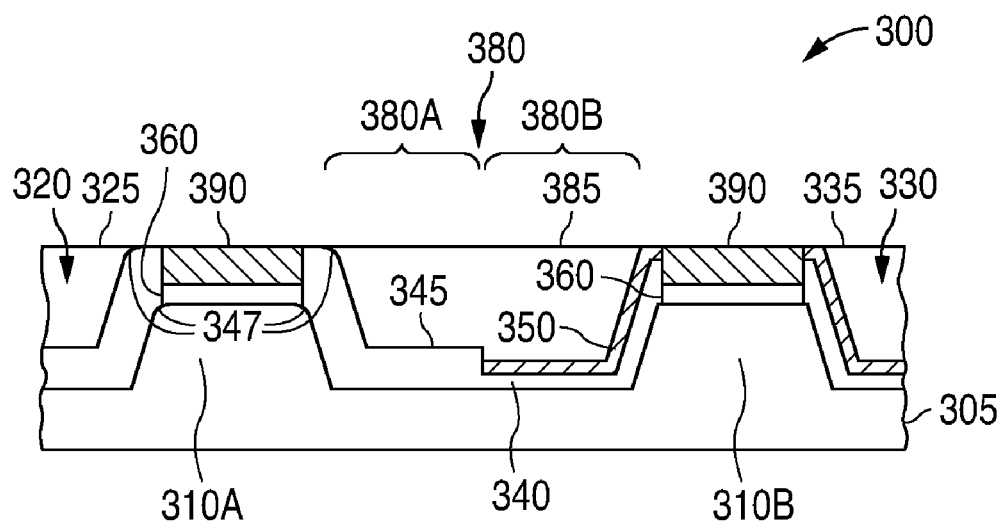

FIGS. 2D and 3D illustrate semiconductor devices 200 and 300, respectively, following step 160. As illustrated in FIG. 2D, transistor regions 210C and 210D are isolated from each other by trench 220 having dielectric material 225 and a silicon dioxide liner in trench 220 provided by thicker silicon dioxide layer 245. In addition, transistor regions 210A and 210B are isolated from each other by trench 230 having dielectric material 235, a silicon dioxide liner in trench 230 provided by silicon dioxide layer 240, and a silicon nitride liner in trench 230 provided by silicon nitride layer 250 (i.e., a dual liner configuration).

As illustrated in FIG. 3D, transistor regions 310A and 310B are isolated from each other by trench 380 having dielectric material 385, a silicon dioxide liner in portion 380A of the trench provided by thicker silicon dioxide layer 345, and liners in portion 380B of the trench provided by silicon dioxide layer 340 and silicon nitride layer 350 (i.e., a dual liner configuration).

Figure 3E:
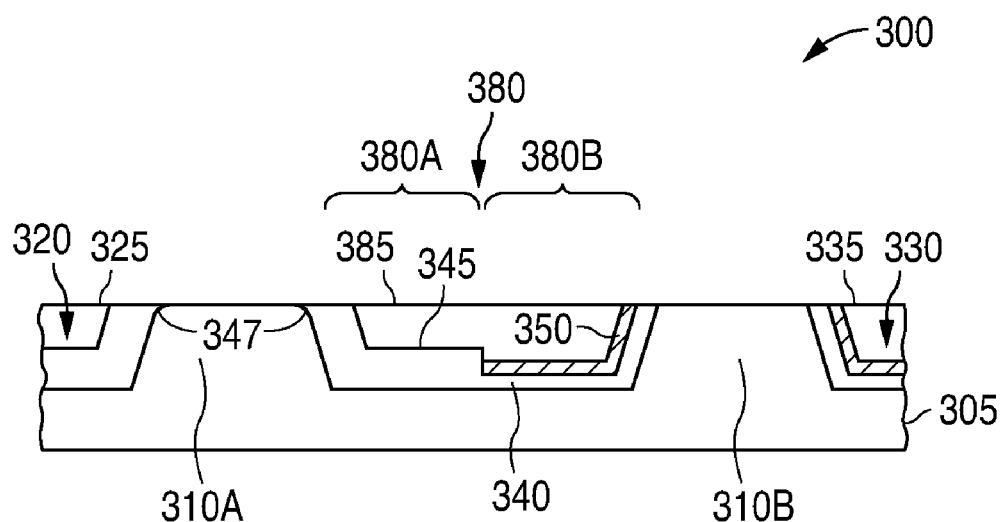

Following step 160, an optional oxide recess etch operation (step 165) and a nitride strip operation (step 170) may be performed to remove remaining portions of dielectric material 225/235 and 325/335/385, silicon nitride layers 250/350, hard masks 290/390, and pad oxide layers 260/360 above substrates 205/305. FIGS. 2E and 3E illustrate semiconductor devices 200 and 300, respectively, following step 170. It will be appreciated that additional conventional processing operations may also be performed (for example, a high density plasma densification operation) to further prepare semiconductor devices 200 and 300 for further processing, such as the manufacture of transistors in transistor regions 210A-D and 310A-B.

In view of FIGS. 2E and 3E, it will be appreciated that the structure of semiconductor devices 200 and 300 can provide isolation for both low and high voltage transistors embedded within the same device. For example, in semiconductor device 200, high voltage transistors may be provided in transistor regions 210C-D and remain isolated from each other by trench 220. Because the previously-deposited silicon nitride layer 250 has been removed from trench 220, high voltage transistors manufactured in transistor regions 210C-D need not experience degraded performance (for example, reduced data retention tendencies in flash memory cells) resulting from silicon nitride in close proximity. In addition, the presence of thicker silicon dioxide layer 245 and the rounding exhibited by its corners 247 can improve the QBD of high voltage transistors manufactured in transistor regions 210C-D. As a result, the performance of hot carrier injection for flash memory cells manufactured in such regions can also be improved.

Also in semiconductor device 200, low voltage transistors may be provided in transistor regions 210A-B and remain isolated from each other by trench 230. Because trench 230 includes silicon nitride layer 250, STI stress effects on low voltage transistors manufactured in transistor regions 210A-B can be reduced.

In semiconductor device 300, high voltage transistors may be provided in transistor region 310A, and low voltage transistors may be provided in transistor region 310B. In this regard, low voltage and high voltage transistors can remain isolated from each other by a single trench 380. Because the previously-deposited silicon nitride layer 350 has been removed from portion 380A of trench 380, high voltage transistors manufactured in transistor region 310A need not experience degraded performance resulting from close proximity of silicon nitride. High voltage transistors in transistor region 310A can also exhibit improved QBD as previously discussed in relation to semiconductor device 200 due to the presence of thicker silicon dioxide layer 345 and the rounding exhibited by its corners 347.

Because portion 380B of trench 380 includes silicon nitride layer 350, STI stress effects on low voltage transistors manufactured in transistor region 310B can be reduced. It will be appreciated that trenches 320 and 330 can further isolate transistors provided in transistor regions 310A and 310B, respectively.

In view of the present disclosure, it will be appreciated that the various trenches of each of semiconductor devices 200 and 300 can advantageously be manufactured simultaneously in accordance with the process of FIG. 1. As a result, STI features can be provided for low voltage and high voltage transistors on the same substrate without incurring excessive additional processing costs and time.

Embodiments described herein illustrate but do not limit the invention. It should also be understood that numerous modifications and variations are possible in accordance with the principles of the present invention. Accordingly, the scope of the invention is defined only by the claims.

The invention claimed is:

1. An integrated circuit comprising:
a substrate having first and second high voltage transistor regions and first and second low voltage transistor regions, the substrate including a first trench between and adjacent to the first and second high voltage transistor regions, a second trench between and adjacent to the first and second low voltage transistor regions, and a third trench between the first and second trenches and between and adjacent to the second high voltage transistor region and the second low voltage transistor region, wherein the trenches have openings at the top surface of the substrate;
a thicker silicon dioxide layer lining the first trench and a first portion of the third trench adjacent to the second high voltage transistor region, the thicker silicon dioxide layer having rounded corners at the openings of the first trench and the first portion of the third trench;
a thinner silicon dioxide layer lining the second trench and a second portion of the third trench adjacent to the second low voltage transistor region;
a silicon nitride layer present on the thinner silicon dioxide layer and lining the second trench and the second portion of the third trench but not present on the thicker silicon dioxide layer and not lining the first trench and the first portion of the third trench; and
dielectric material filling the first, second, and third trenches.

2. The integrated circuit of claim 1, wherein the thicker silicon dioxide layer is at least three times as thick as the thinner silicon dioxide layer.

3. The integrated circuit of claim 1, wherein the high voltage transistor regions are suitable for flash memory cells.

4. The integrated circuit of claim 1, wherein the high voltage transistor regions are suitable for transistors having an operating voltage in the range of approximately 3.3 volts and higher.

5. The integrated circuit of claim 1, wherein the low voltage transistor regions are suitable for transistors having an operating voltage in the range of approximately 1.2 volts to 2.5 volts.

6. The integrated circuit of claim 1, wherein the integrated circuit is a programmable logic device.

7. An integrated circuit comprising:
a substrate having first and second high voltage transistor regions and a low voltage transistor region, the substrate including a first trench between and adjacent to the first and second high voltage transistor regions and a second trench between and adjacent to the second high voltage transistor region and the low voltage transistor region, wherein the trenches have openings at the top surface of the substrate;
a thicker silicon dioxide layer lining the first trench and a first portion of the second trench adjacent to the second high voltage transistor region, the thicker silicon dioxide layer having rounded corners at the openings of the first trench and the first portion of the second trench;
a thinner silicon dioxide layer lining a second portion of the second trench adjacent to the low voltage transistor region;
a silicon nitride layer present on the thinner silicon dioxide layer and lining the second portion of the second trench but not present on the thicker silicon dioxide layer and not lining the first trench and the first portion of the second trench; and
dielectric material filling the first and second trenches.

8. The integrated circuit of claim 7, wherein the thicker silicon dioxide layer is at least three times as thick as the thinner silicon dioxide layer.

9. The integrated circuit of claim 7, wherein the high voltage transistor regions are suitable for flash memory cells.

10. The integrated circuit of claim 7, wherein the high voltage transistor regions are suitable for transistors having an operating voltage in the range of approximately 3.3 volts and higher.

11. The integrated circuit of claim 7, wherein the low voltage transistor region is suitable for transistors having an operating voltage in the range of approximately 1.2 volts to 2.5 volts.

12. The integrated circuit of claim 7, wherein the integrated circuit is a programmable logic device.

13. An integrated circuit comprising:
a substrate having first and second low voltage transistor regions and a high voltage transistor region, the substrate including a first trench between and adjacent to the first and second low voltage transistor regions and a second trench between and adjacent to the second low voltage transistor region and the high voltage transistor region, wherein the trenches have openings at the top surface of the substrate;
a thinner silicon dioxide layer lining the first trench and a first portion of the second trench adjacent to the second low voltage transistor region;
a thicker silicon dioxide layer lining a second portion of the second trench adjacent to the high voltage transistor region, the thicker silicon dioxide layer having a rounded corner at the opening of the second portion of the second trench;
a silicon nitride layer present on the thinner silicon dioxide layer and lining the first trench and the first portion of the second trench but not present on the thicker silicon dioxide layer and not lining the second portion of the second trench; and
dielectric material filling the first and second trenches.

14. The integrated circuit of claim 13, wherein the thicker silicon dioxide layer is at least three times as thick as the thinner silicon dioxide layer.

15. The integrated circuit of claim 13, wherein the high voltage transistor region is suitable for flash memory cells.

16. The integrated circuit of claim 13, wherein the high voltage transistor region is suitable for transistors having an operating voltage in the range of approximately 3.3 volts and higher.

17. The integrated circuit of claim 13, wherein the low voltage transistor regions are suitable for transistors having an operating voltage in the range of approximately 1.2 volts to 2.5 volts.

18. The integrated circuit of claim 13, wherein the integrated circuit is a programmable logic device.

* * * * *